(12) United States Patent
Cohen et al.

(10) Patent No.: US 9,558,062 B2
(45) Date of Patent: Jan. 31, 2017

(54) CYCLIC REDUNDANCY CHECK (CRC) FALSE DETECTION REDUCTION IN COMMUNICATION SYSTEMS

(71) Applicant: QUALCOMM Incorporated, San Diego, CA (US)

(72) Inventors: Roee Cohen, Kibbutz Eyal (IL); Alexander Kleinerman, Superior, CO (US)

(73) Assignee: QUALCOMM Incorporated, San Diego, CA (US)

( * ) Notice: Subject to any disclaimer, the term of this patent is extended or adjusted under 35 U.S.C. 154(b) by 55 days.

(21) Appl. No.: 14/810,120

(22) Filed: Jul. 27, 2015

(65) Prior Publication Data

US 2016/0026523 A1     Jan. 28, 2016

Related U.S. Application Data

(60) Provisional application No. 62/029,950, filed on Jul. 28, 2014.

(51) Int. Cl.
*H03M 13/00* (2006.01)
*G06F 11/10* (2006.01)
(Continued)

(52) U.S. Cl.
CPC .......... *G06F 11/1004* (2013.01); *H03M 13/09* (2013.01); *H04L 1/0046* (2013.01); *H04L 1/0054* (2013.01); *H04L 1/0061* (2013.01)

(58) Field of Classification Search
None
See application file for complete search history.

(56) References Cited

U.S. PATENT DOCUMENTS 5,968,201 A    10/1999  Shida et al.
8,433,989 B2   4/2013   Sipilä et al.
(Continued)

FOREIGN PATENT DOCUMENTS

EP      1 432 165 A1   6/2004
WO      WO-2006/067720 A1   6/2006

OTHER PUBLICATIONS

"3rd Generation Partnership Project; Technical Specification Group Radio Access Network; Multiplexing and channel coding (FDD) (Release 1999)", 3GPP Standard; 3GPP TS 25.212, 3rd Generation Partnership Project (3GPP), Mobile Competence Centre; 650, Route Des Lucioles; F-06921 Sophia-Antipolis Cedex; France, No. V3.11.0, Sep. 1, 2002 (Sep. 1, 2002), pp. 1-62, XP050366732, p. 56-p. 58.

(Continued)

*Primary Examiner* — M. Mujtaba Chaudry
(74) *Attorney, Agent, or Firm* — Arent Fox LLP

(57) ABSTRACT

The present disclosure presents a method and an apparatus for reducing cyclic redundancy check (CRC) false detections at a user equipment (UE). For example, the method may include receiving a data packet at the UE, determining whether a state metric value for each of a plurality of vector elements of a last path metric vector of the data packet is less than or equal to a first threshold, incrementing a counter when the state metric value of a vector element of the plurality of vector elements is less than or equal to the first threshold, determining whether the counter is lower than a second threshold, and providing the data packet to an upper layer protocol entity of the UE when a CRC pass for the data packet is determined and the counter is lower than the second threshold. As such, reduced CRC false detections at a UE may be achieved.

29 Claims, 11 Drawing Sheets

(51) Int. Cl.
*H03M 13/09* (2006.01)
*H04L 1/00* (2006.01)

(56) References Cited

U.S. PATENT DOCUMENTS

| | | |
|---|---|---|
| 8,453,020 B2 | 5/2013 | Aue |
| 2005/0204255 A1* | 9/2005 | Yeh .................. H03M 13/6343 714/755 |
| 2007/0165566 A1* | 7/2007 | Khan ..................... H04B 7/022 370/329 |
| 2011/0083065 A1 | 4/2011 | Singh et al. |
| 2012/0324317 A1* | 12/2012 | Sripathi ................ H04L 1/0054 714/795 |
| 2013/0124947 A1 | 5/2013 | Lane et al. |
| 2013/0336231 A1* | 12/2013 | Ankel ............... H04W 72/1268 370/329 |
| 2014/0302787 A1* | 10/2014 | Rantala ................ H04W 4/008 455/41.2 |

OTHER PUBLICATIONS

International Search Report and Written Opinion—PCT/US2015/042369—ISA/EPO—Sep. 29, 2015. (16 total pages).

* cited by examiner

CYCLIC REDUNDANCY CHECK (CRC) FALSE DETECTION REDUCTION IN COMMUNICATION SYSTEMS

CLAIM OF PRIORITY

The present application for patent claims priority to U.S. Provisional Patent Application No. 62/029,950, filed Jul. 28, 2014, entitled "Cyclic Redundancy Check False Detection Reduction in Communication Systems," which is assigned to the assignee hereof, and hereby expressly incorporated by reference herein.

BACKGROUND

Aspects of the present disclosure relate generally to wireless communication systems, and more particularly, to cyclic redundancy check (CRC) false detection reduction in communication systems.

Wireless communication networks are widely deployed to provide various communication services such as telephony, video, data, messaging, broadcasts, and so on. Such networks, which are usually multiple access networks, support communications for multiple users by sharing the available network resources. One example of such a network is the UMTS Terrestrial Radio Access Network (UTRAN). The UTRAN is the radio access network (RAN) defined as a part of the Universal Mobile Telecommunications System (UMTS), a third generation (3G) mobile phone technology supported by the 3rd Generation Partnership Project (3GPP). The UMTS, which is the successor to Global System for Mobile Communications (GSM) technologies, currently supports various air interface standards, such as Wideband-Code Division Multiple Access (W-CDMA), Time Division-Code Division Multiple Access (TD-CDMA), and Time Division-Synchronous Code Division Multiple Access (TD-SCDMA). The UMTS also supports enhanced 3G data communications protocols, such as High Speed Packet Access (HSPA), which provides higher data transfer speeds and capacity to associated UMTS networks.

In some wireless communication networks, inefficient and/or ineffective utilization of available communication resources, particularly related to error detection, may lead to degradations in wireless communication. Even more, the foregoing inefficient resource utilization inhibits user equipments and/or wireless devices from achieving higher wireless communication quality.

For example, W-CDMA systems provide data services using transmission links and associated protocols. At a receiving entity (e.g., a user equipment) in a W-CDMA system, the channel format of a block of data sent by a transmitting entity (e.g., a base station) has to be correctly identified and the overhead and payload in the data have to be correctly decoded to enable proper operation of the system. Some coding schemes are described in detail in 3GPP Standard Technical Specification (TS) 25.102. An example coding scheme for the receiving entity is blind transport format detection (BTFD) for detecting the format of transport channels, and, in particular, for detecting an end of a block of data for a channel. This is based on the information that the block may be terminated by an error detection code, e.g., a cyclic redundancy check (CRC) code. The BTFD mechanism uses the information that the block is terminated by a CRC code to determine whether a given sequence of bits is a CRC code for a block of data (bits) preceding the CRC code (bits). For example, explicit BTFD may involve performing recursive Viterbi decoding followed by CRC checks. When a CRC pass is detected, state variables are updated and the resulting decoded bits are passed to the upper protocol layers. However, in some instances, the recursive decoding may result in a false CRC pass where the detected transport format was not actually transmitted.

For example, CRC bits may help ensure that a receiving entity decodes a grant message correctly when the grant message was actually sent by the transmitting entity. However, this may not be enough to stop the receiving entity from falsely detecting a grant message when no grant message was sent by the transmitting entity or another type of message was sent by the transmitting entity. The receiving entity, in some cases, may decode bits that may match valid CRC bits, resulting in the receiving entity detecting a false grant message, referred to as "ghost grants." The upper protocol layers of the receiving entity may treat the ghost grants as a valid grant (e.g., genuine or valid packets received from the physical layer) which may affect performance of the UE and/or the network, e.g., dropped voice calls. Additionally, as grant messages (e.g., absolute grant messages) indirectly control the uplink (UL) power level, false detection of a grant message negatively affects network capacity and/or receiving entity throughputs. For example, a false grant message may set the receiving entity transmit power at a level different from the level intended by the transmitting entity, e.g., a serving base station or cell, and may cause interference with other entities (e.g., other UEs or cells).

Therefore, there is a need for improved methods of signal detection for reducing the occurrences or probability of false detection of data sent by a transmitting entity.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

The present disclosure presents an example method and apparatus for reducing cyclic redundancy check (CRC) false detections at a user equipment (UE). For example, the present disclosure presents an example method that may include receiving a data packet at the UE, determining whether a state metric value for each of a plurality of vector elements of a last path metric vector of the data packet is less than or equal to a first threshold, incrementing a counter when the state metric value of a vector element of the plurality of vector elements is less than or equal to the first threshold, wherein the counter is incremented for each of the plurality of vector elements in which the state metric value is less than or equal to the first threshold, determining whether the counter is lower than a second threshold, and providing the data packet to an upper layer protocol entity of the UE when a CRC pass for the data packet is determined and the counter is lower than the second threshold.

Additionally, the present disclosure presents an example apparatus for reducing cyclic redundancy check (CRC) false detections that may include means for receiving a data packet at the UE, means for determining whether a state metric value for each of a plurality of vector elements of a last path metric vector of the data packet is less than or equal to a first threshold, means for incrementing a counter when the state metric value of a vector element of the plurality of vector elements is less than or equal to the first threshold, wherein the counter is incremented for each of the plurality of vector elements in which the state metric value is less than or equal to the first threshold, means for determining whether the counter is lower than a second threshold, and means for providing the data packet to an upper layer protocol entity of the UE when a CRC pass for the data packet is determined and the counter is lower than the second threshold.

In a further aspect, the presents disclosure presents an example computer readable medium storing computer executable code for reducing cyclic redundancy check (CRC) false detections at a user equipment (UE) that may include code for receiving a data packet at the UE, code for determining whether a state metric value for each of a plurality of vector elements of a last path metric vector of the data packet is less than or equal to a first threshold, code for incrementing a counter when the state metric value of a vector element of the plurality of vector elements is less than or equal to the first threshold, wherein the counter is incremented for each of the plurality of vector elements in which the state metric value is less than or equal to the first threshold, code for determining whether the counter is lower than a second threshold, and code for providing the data packet to an upper layer protocol entity of the UE when a CRC pass for the data packet is determined and the counter is lower than the second threshold.

Furthermore, in an aspect, the present disclosure presents an example mobile apparatus to reduce cyclic redundancy check (CRC) false detections that may include a receiver configured to receive a data packet and a processor coupled to a memory, the processor configured to determine whether a state metric value for each of a plurality of vector elements of a last path metric vector of the data packet is less than or equal to a first threshold, increment a counter when the state metric value of a vector element of the plurality of vector elements is less than or equal to the first threshold, wherein the counter is incremented for each of the plurality of vector elements in which the state metric value is less than or equal to the first threshold, determine whether the counter is lower than a second threshold, and provide the data packet to an upper layer protocol entity of the UE when a CRC pass for the data packet is determined and the counter is lower than the second threshold.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

The features, nature, and advantages of the present disclosure will become more apparent from the detailed description set forth below when taken in conjunction with the drawings in which like reference characters identify correspondingly throughout and wherein.

DETAILED DESCRIPTION

Figure 1:
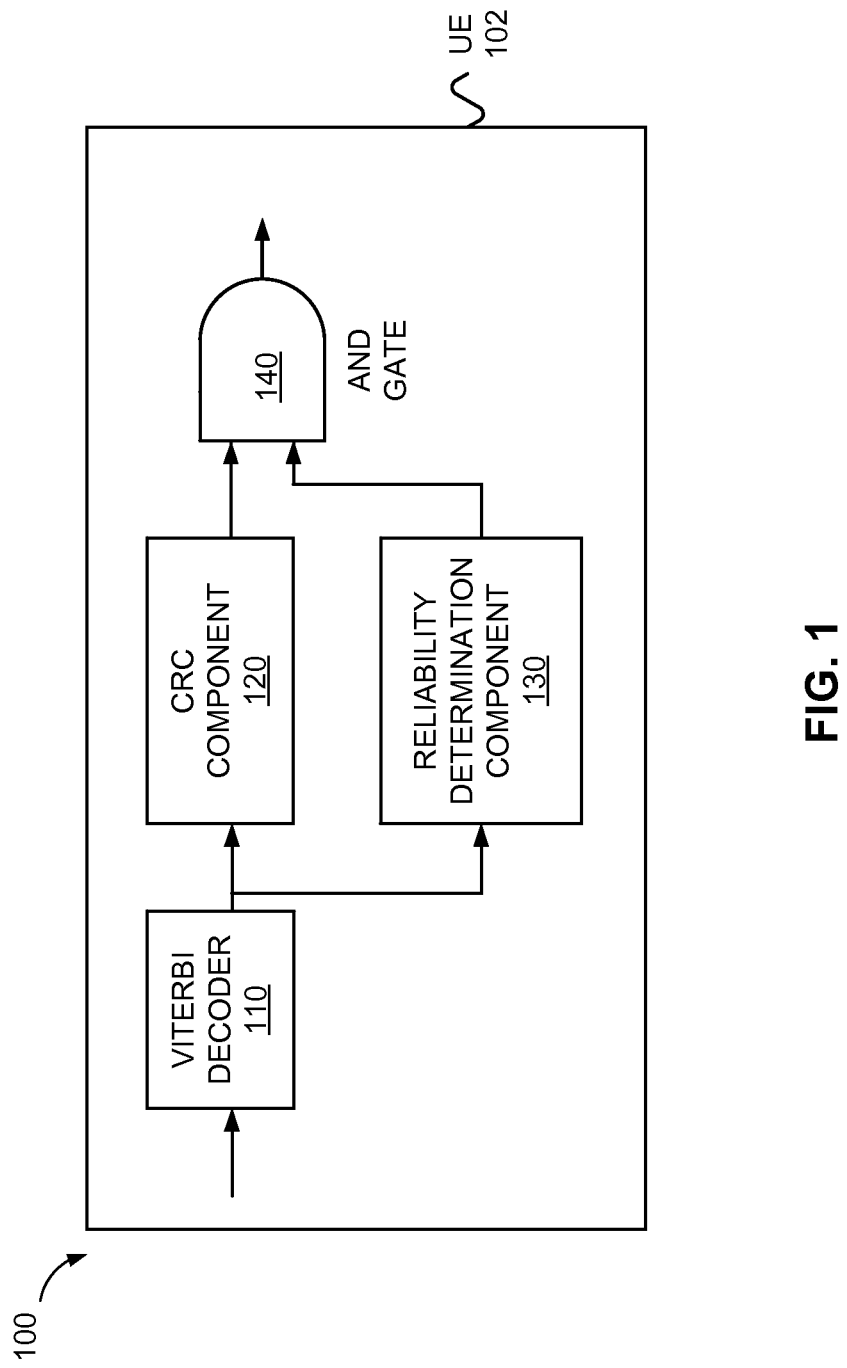
FIG. 1 is a block diagram illustrating an example wireless system including an example user equipment having a reliability determination component according to aspects of the present disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known components are shown in block diagram form in order to avoid obscuring such concepts. In an aspect, as used herein, a component may be one of the parts that make up a system, may be hardware or software, and may be divided into other components.

The present aspects generally relate to reducing a cyclic redundancy check (CRC) false pass rate for received data in communication systems. Specifically, in some wireless communication systems, CRC may be performed on each received block of data (or data packet) based on CRC information included within the packet. The data packet may be received at the UE (e.g., a physical layer of the UE). Although CRC provides a reliable indication as to the integrity of a data packet, CRC may nonetheless mistakenly indicate a defective packet (e.g., a data block containing noise or a wrong code word) as valid (e.g., a CRC pass). In such cases, providing such defective packets to the upper protocol layers (e.g., medium access control (MAC) layer) may result in degradation in wireless communication quality. For example, a voice call may be dropped or disrupted due to these defective packets passing through the upper protocol layers. Additionally, one or more of a power level at a user equipment (UE), or a network capacity, or a UE throughput may be negatively affected by the defective packets, which may cause a change in a setting or configuration of the UE or the network that affect such metrics. As such, the present aspects provide a determination as to a reliability or integrity of the data packet, prior to or in addition to CRC processing.

The present method and apparatus provides an efficient and effective solution to reduce CRC false detection. In an aspect, the present disclosure presents a method and an apparatus for generating a reliability metric of a last path metric vector generated by a Viterbi algorithm when the decoding scheme at a receiving entity, such as a user equipment, includes a Viterbi decoder followed by CRC component (e.g., CRC component). As will be explained in more detail below, the present aspects use the presence of tail bits at the end of a packet to distinguish between a valid packet (e.g., signal) and random noise. For instance, in one use case, a valid packet may contain a known number tail bits of zero, whereas random noise may not include the known number of tail bits of zero. As such, according to the Viterbi algorithm, once all of the known number of tail bits are processed, it is expected that state 0 of the last path metric vector output by the Viterbi decoder should have the best (e.g., lowest) state metric value, or should be among the best, whereas if random noise were received then any state in the last path metric vector may have the best value. In other words, the known number of tail bits essentially flush the Viterbi decoder and return it to an initial state, so the closer the Viterbi decoder is to processing all of the tail bits, the closer the state 0 should be to approaching the lower state metric value. Based on this principle, the present aspects can process a received data packet having an unknown format and compare a state metric value of state 0 to a threshold and determine if state 0 is among the best (e.g., lowest) state metric values, e.g., one of a threshold number of states having the best (e.g., lowest) state metric values. This may be referred to as a State 0 Among Finalists methodology. As such, based on whether or not the state 0 state metric value is among the best, the present aspects generate a reliability metric (e.g., indicating good or bad reliability) that may be used to distinguish between correct and false (incorrect) detections of valid data packets, thereby reducing the probability of CRC false detections. In some cases, the present aspects may also have a negligible impact on missed detection performance, e.g., a decision of "invalid CRC pass" when a valid data packet is present.

In particular, the output of a Viterbi decoder may be represented in a diagram, e.g., a Trellis graph, having rows representing the possible encoder states and columns representing each time instant in a decoded data packet, with lines that define paths connecting state transitions from one time instant to another and state metrics that define an accumulated error between the states at the previous time instance and the states at the current time instance. For example, for a Viterbi decoder having 256 states and for a data packet having 60 data bits, the Trellis graph would have 256 rows and 60 columns, and state 0 would have a state metric value of 0 at an initial time instance and also a value of 0 or another value that is among the best values at a last time instance, e.g., the last path metric, when a valid data packet is received. As such, for a Trellis graph, each column of values may be considered as a vector and the numbers in the vector, referred to as vector elements or elements, represent path metrics (or path metric values) which is a total distance from state 0 (e.g., source node) to the node. A state metric value may be defined as a value of total distance up to the present state. The last metric vector is the right most column in the matrix.

Specifically, the present method and apparatus may receive a path metric vector (e.g., a last path metric vector), also referred to as a state metric vector (e.g., a last state metric vector), from a Viterbi decoder and, based on existence of known tail bits at the end of a data packet, distinguish between a valid data packet and noise. In particular, the last path metric vector may be associated with a data packet and may include a plurality of vector elements corresponding to a plurality of encoder states of the Viterbi decoder.

To make the distinction between a valid packet and random noise (e.g., thermal noise), the present method and apparatus may perform a State 0 Among Finalists analysis. For instance, the present method and apparatus may use a reliability metric based on the knowledge that some tail bits are added to a proper code block (e.g., proper packet) which will make a final path metric vector to be biased in a way that state 0 may be the best or among the best by determining whether a state metric ("SM") value for each of the plurality of vector elements is less than or equal to a first threshold value, where the first threshold value may be adjustably configured to a level that indicates a reliability. The present aspects may determine an order or index of a first element (e.g., SM[0]) in a sorted vector (e.g., sorted from lowest SM value to highest SM value) and compare the first element with the first threshold value. In addition, the present method and apparatus may increment a counter value when the state metric value of a vector element of the plurality of vector elements is less than or equal to the first threshold value. Moreover, the present method and apparatus may determine whether the counter value equals or exceeds a second threshold value. Further, the present aspects may decrease the second threshold value when the data packet has passed the CRC test. The present method and apparatus may also provide the data packet to an upper layer protocol entity (e.g., MAC layer) when a CRC pass for the data packet is determined and the counter value does not meet or exceed a second threshold value. Accordingly, the present method and apparatus provide reduced CRC false detection and/or have a minor impact on the missed detection performance.

Referring to FIG. 1, in an aspect, a communications system 100 is illustrated that includes a user equipment (UE) 102, a Viterbi decoder 110, a CRC component 120, a reliability determination component 130, and/or an AND gate 140 for CRC false detection reduction (e.g., for reducing CRC "false pass" occurrences) in the communications system. For example, a CRC false pass may occur when CRC component 120 outputs a "valid CRC pass" decision when signal is absent (e.g., no signal is transmitted by the transmitting entity). In an aspect, output of CRC component 120 and output of reliability determination component 130 are connected via an AND gate 140 so that a CRC pass is declared only when CRC component 120 outputs a pass and the reliability determination component 130 outputs a reliability metric value of "GOOD" for reducing CRC false detection reduction at the UE as described below in detail.

Figure 2:
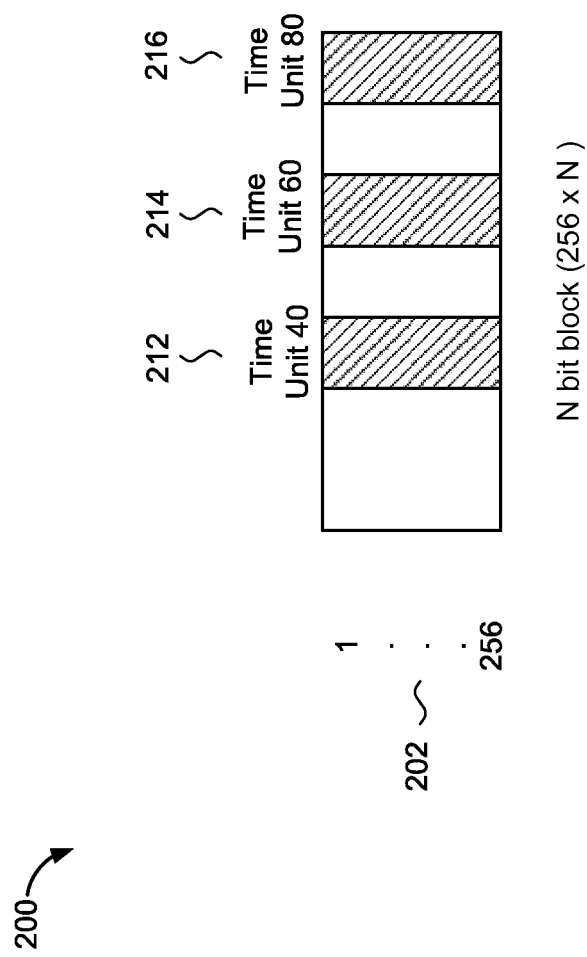
FIG. 2 is an example matrix that illustrates distinguishing between a real packet and random noise according to aspects of the present disclosure.

FIG. 2 is an example matrix that illustrates distinguishing between a real packet and random noise according to aspects of the present disclosure.

In an example aspect, a 256×40 matrix is generated for a symbol that is received at UE 102 (e.g., at receiver of UE 102). The 256×40 matrix 202 includes values for the 256 states (e.g., state metric values) represented by the values in the columns which may be an accumulated distance from a source node. The values in the last column may be sorted for identifying the minimum values which may correspond to state zero. In an aspect, if the receiver received a real packet (i.e., not random noise), the value of state zero will be the minimum value or at least one of the minimum values. In an additional or optional aspect, if the receiver received random noise (i.e., transmitter did not transmit anything), any element in the last column (e.g., $40^{th}$ column) may be the minimum value or one of the minimum values.

However, a UE's receiver does not have any knowledge of the size of the packet transmitted from the transmitter. For example, a receiver of UE 102 does not have any knowledge of whether the packet is 40, 60, or 80 bits long. In an aspect, for example, after time unit 40 (212), state metric values may be calculated for the various states and the calculated state metric values are sorted and compared with state metric value of state zero. For instance, in an aspect, if there are states (e.g., 15 elements) with state metric values less than the value of state zero, then calculating of state metric values continues till the next optional block, e.g., time unit 60 (214). The order of state zero may be called as the reliability metric. The process of calculating state metric values, sorting the calculated state metric values, and comparing state metric values with state zero are repeated, and the reliability metrics are calculated. If the reliability metric at time unit 60 is better than the reliability metric at time unit 40, the reliability metric at time unit 40 is discarded (if CRC passes), and so on.

Figure 3:
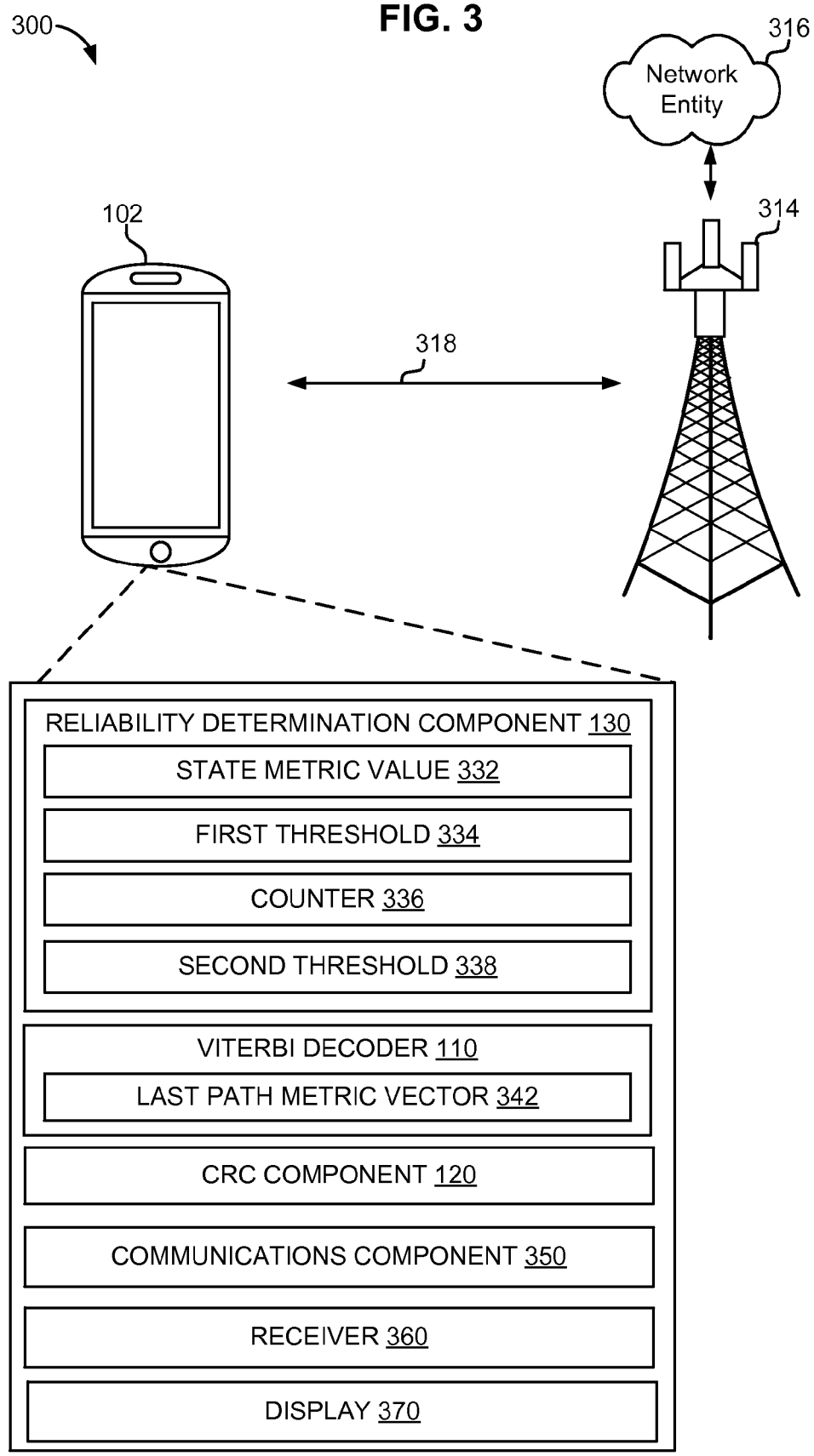
FIG. 3 is a flow diagram illustrating aspects of an example method in aspects of the present disclosure.

Referring to FIG. 3, in an aspect, a wireless communication system 300 includes UE 102 in communication coverage of base station 314. UE 102 may communicate with network entity 316 via base station 314. In some aspects, multiple UEs, including UE 102, may be in communication coverage with one or more base stations, including base station 314. In an example, UE 102 may transmit and/or receive wireless communications to and/or from base station 314 via one or more communication channels 318, and may include a receiver 360 and a display 370. Such wireless communications may include, but are not limited to, one or more data packets.

In an aspect, UE 102 may also be referred to by those skilled in the art (as well as interchangeably herein) as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a terminal, a user agent, a mobile client, a client, a device for the Internet-of-Things, or some other suitable terminology. Additionally, base station 314 may be a macrocell, small cell, picocell, femtocell, relay, Node B, mobile Node B, UE (e.g., communicating in peer-to-peer or ad-hoc mode with UE 102), or substantially any type of component that can communicate with UE 102 to provide wireless network access at the UE 102.

According to the present aspects, UE 102 may include reliability determination component 130, which may be configured to reduce CRC false detections, e.g., a decision of "valid CRC pass" when a valid data packet is not actually transmitted by the transmitting entity (e.g., base station 314). For example, reliability determination component 130 may be configured to determine reliability of a data packet from an output of a Viterbi decoder 110 prior to (e.g., without considering) CRC determination by CRC component 120. In some aspects, CRC component 120 may execute a class of linear error detecting codes which generate parity check bits by finding the remainder of a polynomial division. The output of CRC component 120 may be, for example, a decision of a "valid CRC pass" or "pass" when a signal (e.g., data packet) is present or a decision of "invalid CRC pass" or "false pass" when a signal is not present (e.g., may be noise). However, CRC component 120 may incorrectly output a "valid CRC pass" or "pass" decision when a signal is not present.

In an aspect, upon receiving communication (e.g., signal) in the form of, for example, one or more data packets, from base station 314, communications component 350 may provide the one or more data packets to Viterbi decoder 110. In an aspect, UE 102 may include a receiver 360 for receiving and decoding RF signals. The receiver 360 may include hardware, firmware, and/or software code executable by a processor for receiving data. The receiver 360 may be, for example, a radio frequency (RF) receiver. In an aspect, the receiver 360 may receive and decode signals transmitted by base station 314 and/or network entity 316. In an additional or optional aspect, receiver 360 may be included in a transceiver at UE 102. Viterbi decoder 110 may utilize a Viterbi decoding procedure in decoding a stream of data (e.g., bits) associated with the one or more data packets that have been encoded using, for instance, a convolutional code. In such aspects, a Viterbi procedure may be a dynamic programming procedure for locating a most likely sequence of a hidden state (e.g., Viterbi path) that results in a sequence of observed events. Additionally, a convolutional code may be a type of error-correcting code in which each m-bit information symbol (each m-bit string) to be encoded is transformed into an n-bit symbol, where m/n is the code rate (e.g., with n >m) and the transformation may be a function of the last k information symbols, where k is the constraint length of the code.

In an aspect, UE 102 may include a communication component which may include a bus or other links to enable communication between the components of UE 102 and/or reliability determination component 130 and interface for communication with external devices or components. Additionally, UE 102 may include a display 370 for visually displaying output of the UE 102. For example, display 370 may be a liquid crystal display (LCD).

For example, reliability determination component 130 may use a last path metric vector 342 associated with a data packet (e.g., which includes a plurality of vector elements) for decoding. In other aspects, the last path metric vector 342 may be associated with random noise (or noise). For instance, in an aspect, reliability determination component 130 may use a last path metric vector 342 that may include a number of tail bits, e.g., eight tail bits. The number of tail bits depends on the configuration. In such aspects, reliability determination component 130 may be configured to identify a valid or reliable data packet as one having or otherwise including the tail bits (e.g., eight tail bits) set to zeroes. In an additional or optional aspect, reliability determination component 130 may be configured to identify an invalid or unreliable data packet (e.g., random noise) as one without the tail bits. That is, the last path metric vector 342 may be associated with a proper data packet if the tail bits are set to zeroes while in other aspects the last path metric vector is associated with random noise symbols the tail bets are absent. In an additional aspect, reliability determination component 130 may be configured to identify a valid or reliable data packet based on the number of vector elements in the last path metric vector with a sate metric value lower than or equal to the state metric value of state zero (e.g., SM[0]).

Further, reliability determination component 130 may be configured to determine whether state metric value 332 for each of the number of vector elements in the last path metric vector is less than or equal to a first threshold 334. In an aspect, the first threshold 334 may be set to a value which is equal to state metric value of state zero. For example, reliability determination component 130 may be configured to determine whether state metric value 332 associated with a vector element is less than or equal to the first threshold 334. Accordingly, reliability determination component 130 may be configured to increment counter 336 when the state metric value 332 of a vector element is less than or equal to the first threshold 334. However, reliability determination component 130 may be configured to skip incrementing counter 236 and proceed to comparing the state metric value 332 of a subsequent vector element with state metric value of state zero when state metric value 332 for the previous vector element is not less than or equal to (e.g., greater than) the first threshold 334.

For example, in an aspect, reliability determination component 130 may be configured to increment counter 336 when a state metric value for a vector element is less than or equal to the state metric value of state zero, e.g., SM[0]. However, reliability determination component 130 may be configured to skip incrementing counter 336 and proceed to comparing the state metric value of a subsequent vector element when the state metric value of the previous vector element is greater than the state metric value of state zero, SM[0].

In addition, reliability determination component 130 may be configured to provide an indication as to the reliability of the data packet by determining whether counter 336 equals or exceeds a second threshold 338. In some aspects, the second threshold 338 may be alternatively referred to as $N_{finalists}$, where the value of $N_{finalists}$ may be the highest number of vector elements in last path metric vector 342. Further, CRC component 120 may be configured to perform a CRC procedure on or using the data packet to output or provide a CRC reliability indication (e.g., CRC pass or CRC fail). In an aspect, reliability determination component 130 may be configured to provide the data packet to an upper layer protocol entity when CRC component 120 determines a CRC pass for the data packet and the counter 336 does not meet or exceed second threshold 338.

In some non-limiting aspects, the second threshold 338 is initially set to a value of 256 (e.g., 8 tail bits with 256 states) or any user defined value according to the application associated with the packet data being received and/or the required balance between CRC missed detections (e.g., false negatives) and false passes. A CRC missed detection may be defined as CRC component 120 outputting a decision of "Invalid CRC pass" when signal is present. Further, the second threshold 338 may be configurable based on one or more of results of the reliability determination component 130 and CRC component 120. For instance, reliability determination component 130 may be configured to decrease second threshold 338 when counter 336 is less than or equal to second threshold 338, and in some aspects, when the CRC passed. In an aspect, the decreasing of second threshold 338 may be repeated for a transport format (e.g., in BTFD) that achieves a CRC pass with lower value from reliability determination component 130. The lowest value for second threshold 338 may be 0. That is, value of state 0 (e.g., SM[0]) is the minimal value among the last metric vector in the Viterbi decoder. In a further additional or optional aspect, second threshold 338 may be reset (e.g., to a value of 256) for a new packet received at the UE (e.g., at the physical layer of the UE).

Moreover, in an alternative or additional aspect, UE 102 may include communications component 350 configured to facilitate or otherwise enable UE 102 to communicate with base station via one or more communication channels according to or utilizing one or more RATs. In such aspects, the one or more communication channels 318 may enable communication on both the uplink and downlink between UE 102 and base station 314.

For example, in a non-limiting aspect, when decoding is performed on W-CDMA R99 voice channels using blind transport format detection (BTFD) configuration, second threshold 338 may be initially set to a value of 356, and each transport format (e.g., each determination that the state metric value is less than or equal to the first threshold value) that passes the CRC (e.g., CRC pass indication) may decrease the second threshold 338. Further, when decoding is performed on random noise (e.g., tail bits are absent), the probability of having state 0 among the final four i.e., $N_f=4$) is $$\frac{4}{256}$$

since every state can have the ideal state metric with equal probability. Such an aspect would result in a reduction of the probability of false pass rate by a factor of $$\frac{4}{256} = \frac{1}{64}.$$

This factor of reduction may be multiplied by the probability for CRC false pass represented as $2^{-CRCLength}$. As such, the final probability for CRC false pass may be:

$$P_{False\ pass} = \frac{1}{2^{CRCLength}} \cdot \frac{N_f}{N_{states}}$$

Referring to FIG. 3, the methods are shown and described as a series of acts for purposes of simplicity of explanation. However, it is to be understood and appreciated that the methods (and further methods related thereto) are not limited by the order of acts, as some acts may, in accordance with one or more aspects, occur in different orders and/or concurrently with other acts from that shown and described herein. For example, it is to be appreciated that the methods may alternatively be represented as a series of interrelated states or events, such as in a state diagram. Moreover, not all illustrated acts may be required to implement a method in accordance with one or more features described herein.

Figure 4:
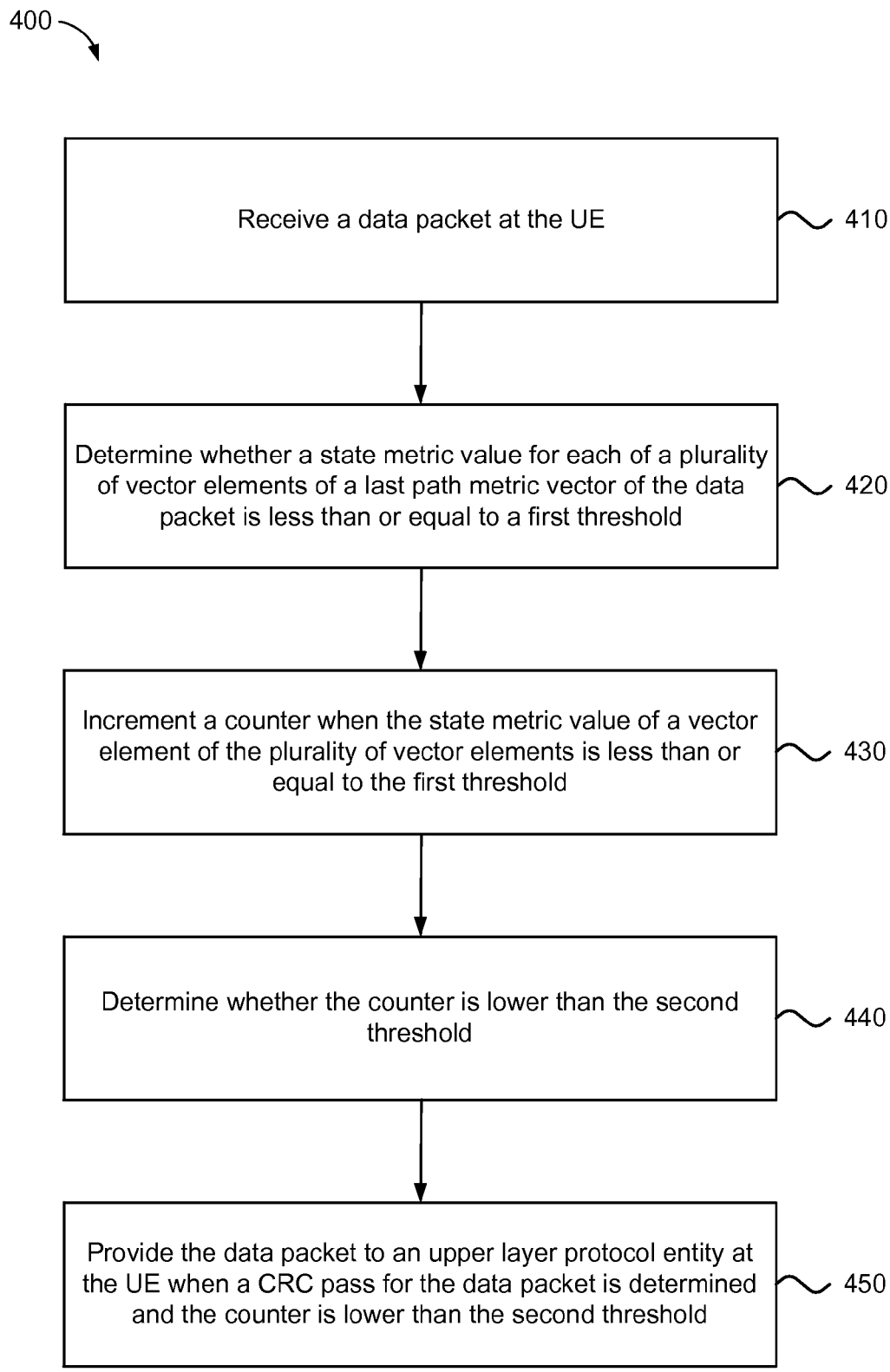
FIG. 4 is a flowchart illustrating an example aspect of the present disclosure.

FIG. 4 illustrates an example methodology 400 for cyclic redundancy check (CRC) false detection reduction at a user equipment (UE).

In an aspect, at block 410, methodology 400 may include receiving a data packet at the UE. For example, in an aspect, UE 102 and/or reliability determination component 130 may include a specially programmed processor module, or a processor executing specially programmed code stored in a memory, to receive a data packet at the UE (e.g., physical layer 1007 of FIG. 7). In an aspect, reliability determination component 130 may include a receiving component 352 to perform this functionality.

In an aspect, at block 420, methodology 400 may include determining whether a state metric value for each of a plurality of vector elements of a last path metric vector of the data packet is less than or equal to a first threshold. For example, in an aspect, UE 102 and/or reliability determination component 130 may include a specially programmed processor module, or a processor executing specially programmed code stored in a memory, to determine determining whether a state metric value for each of a plurality of vector elements of a last path metric vector of the data packet is less than or equal to a first threshold. For example, as described herein, UE 102 (FIG. 1) may execute reliability determination component 130 (FIG. 1) to determine whether a state metric value 332 (FIG. 3) for each of a plurality of vector elements of a last path metric of the data packet is less than or equal to a first threshold 334 (FIG. 3). In an aspect, reliability determination component may include a state metric value determining component 354 to perform this functionality.

In an aspect, at block 430, methodology 400 may include incrementing a counter when the state metric value of a vector element of the plurality of vector elements is less than or equal to the first threshold, wherein the counter is incremented for each of the plurality of vector elements in which the state metric value is less than or equal to the first threshold. For example, in an aspect, UE 102 and/or reliability determination component 130 may include a specially programmed processor module, or a processor executing specially programmed code stored in a memory, to increment a counter when the state metric value of a vector element of the plurality of vector elements is less than or equal to the first threshold, wherein the counter is incremented for each of the plurality of vector elements in which the state metric value is less than or equal to the first threshold. For example, as described herein, UE 102 (FIG. 1) may execute reliability determination component 130 (FIG. 1) to increment counter 336 (FIG. 3) when the state metric value 332 (FIG. 3) of a vector element is less than or equal to first threshold 334 (FIG. 3). In an additional aspect, the counter 336 is incremented for each of the plurality of vector elements in which the state metric value is less than or equal to the first threshold, that is, once every time the state metric value of a vector element associated with the data packet is less than or equal to the first threshold 334. In an aspect, reliability determination component may include a counter incrementing component 356 to perform this functionality.

In an aspect, at block 440, methodology 400 may include determining whether the counter is lower than a second threshold. For example, in an aspect, UE 102 and/or reliability determination component 130 may include a specially programmed processor module, or a processor executing specially programmed code stored in a memory, to determining whether the counter is lower than a second threshold. For example, as described herein, UE 102 (FIG. 1) may execute reliability determination component 130 (FIG. 1) to determine whether counter 336 (FIG. 3) is lower than second threshold 338 (FIG. 3). In an aspect, reliability determination component may include counter comparing component 358 to perform this functionality.

In an aspect, at block 450, methodology 400 may include providing the data packet to an upper layer protocol entity of the UE when a CRC pass for the data packet is determined and the counter is lower than the second threshold. For example, in an aspect, UE 102 and/or reliability determination component 130 may include a specially programmed processor module, or a processor executing specially programmed code stored in a memory, to provide the data packet to an upper layer protocol entity of the UE (e.g., MAC layer 1009 of FIG. 9) when a CRC pass for the data packet is determined and the counter is lower than the second threshold. For example, as described herein, UE 102 (FIG. 1) may execute reliability determination component 130 (FIG. 1) to provide the data packet to an upper layer protocol entity of the UE when a CRC pass for the data packet is determined and counter 336 (FIG. 3) is lower than second threshold 338 (FIG. 3). In an aspect, reliability determination component may include a packet transmission component 362 to perform this functionality.

Figure 5:
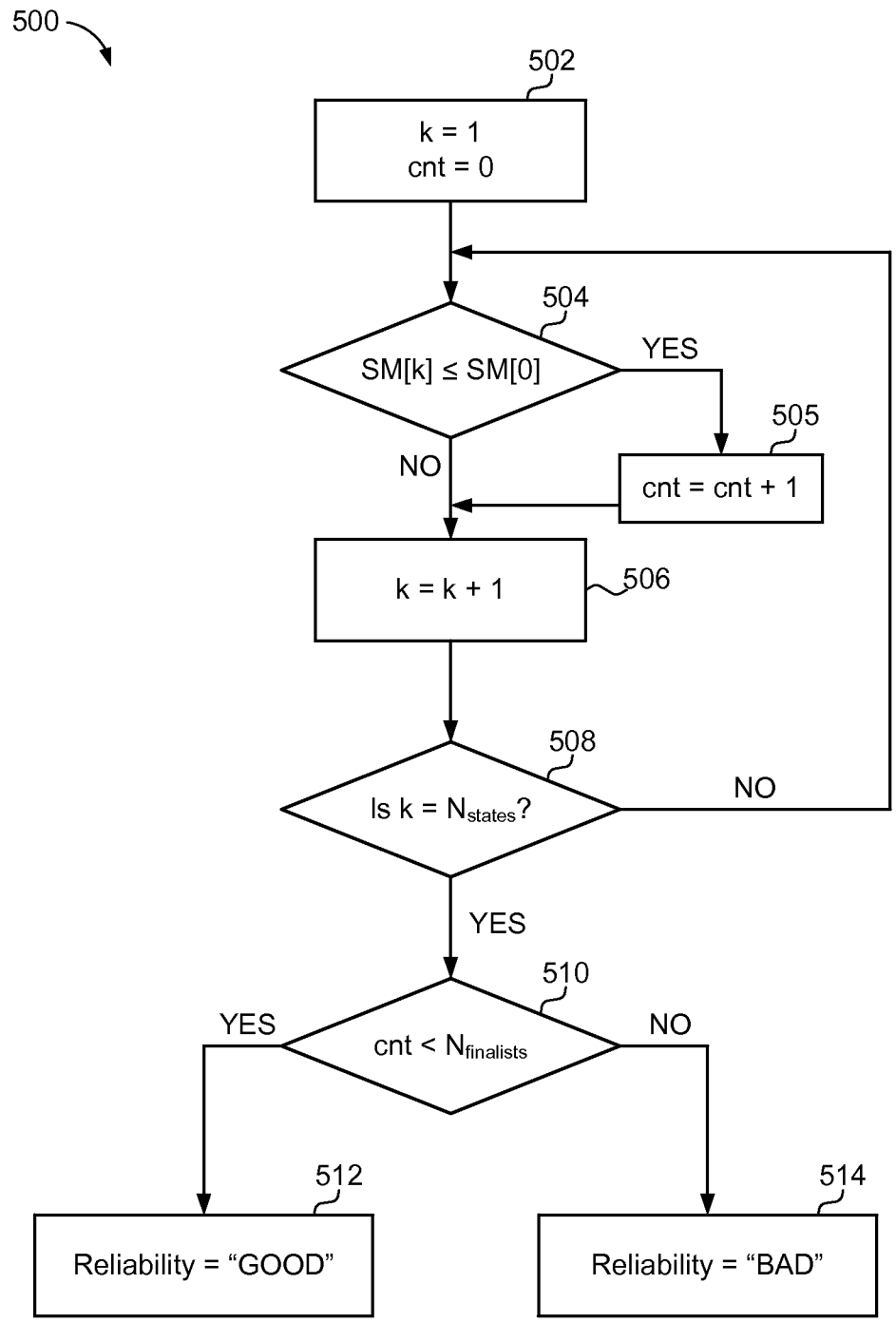
FIG. 5 is an additional flowchart illustrating an example aspect of the present disclosure.

Referring to FIG. 5, in an aspect, UE 102 and/or reliability determination component 130 (of FIG. 1) may perform an aspect of a method 500 for reducing CRC false detection.

In an aspect, at block 502, method 500 may initialize k to a value of 1 (e.g., k=1 and count (cnt) to a value of zero (e.g., (cnt)=0). For instance, the variable k may be the index for which the state metric value is compared to the state metric value of state zero. The cnt variable may be the same or similar as counter 336 (FIG. 3). At block 504, method 500 may determine whether the state metric value of index k (e.g., SM[k]) is less than or equal to the state metric value of index of zero (e.g., SM[0]), which may be the same as or similar to first threshold 334 (FIG. 3). Method 500 may proceed to block 505 when the determination at block 504 is in the affirmative and cnt is incremented (e.g., by 1). Otherwise, method 500 may proceed to block 506 where k is incremented (e.g., such that next vector element in the vector is considered for comparing with state metric value of zero).

At block 508, method 500 may determine whether k is equal to $N_{states}$ (e.g., the number of states indicating that all the vector elements in the last past metric vector were compared). Method 500 may return to block 504 when k is less than $N_{states}$. That is, not all the vector elements were compared and additional vector elements are remaining for comparison. Otherwise, method 500 may proceed to block 510 to determine whether cnt is less than $N_{finalists}$, which may be the same as or similar to second threshold 338 (FIG. 3). Method 500 may proceed to block 512 and indicate the data packet as reliable or "GOOD" packet when cnt is less than $N_{finalists}$. Otherwise, method 500 may proceed to block 514 and indicate the data packet as not reliable or "BAD" packet when cnt is not less than the $N_{finalists}$. In an additional aspect, reliability determination component 130 may perform the steps or functions described above at blocks 502, 504, 505, 506, 508, 510, 512, and/or 514.

Figure 6:
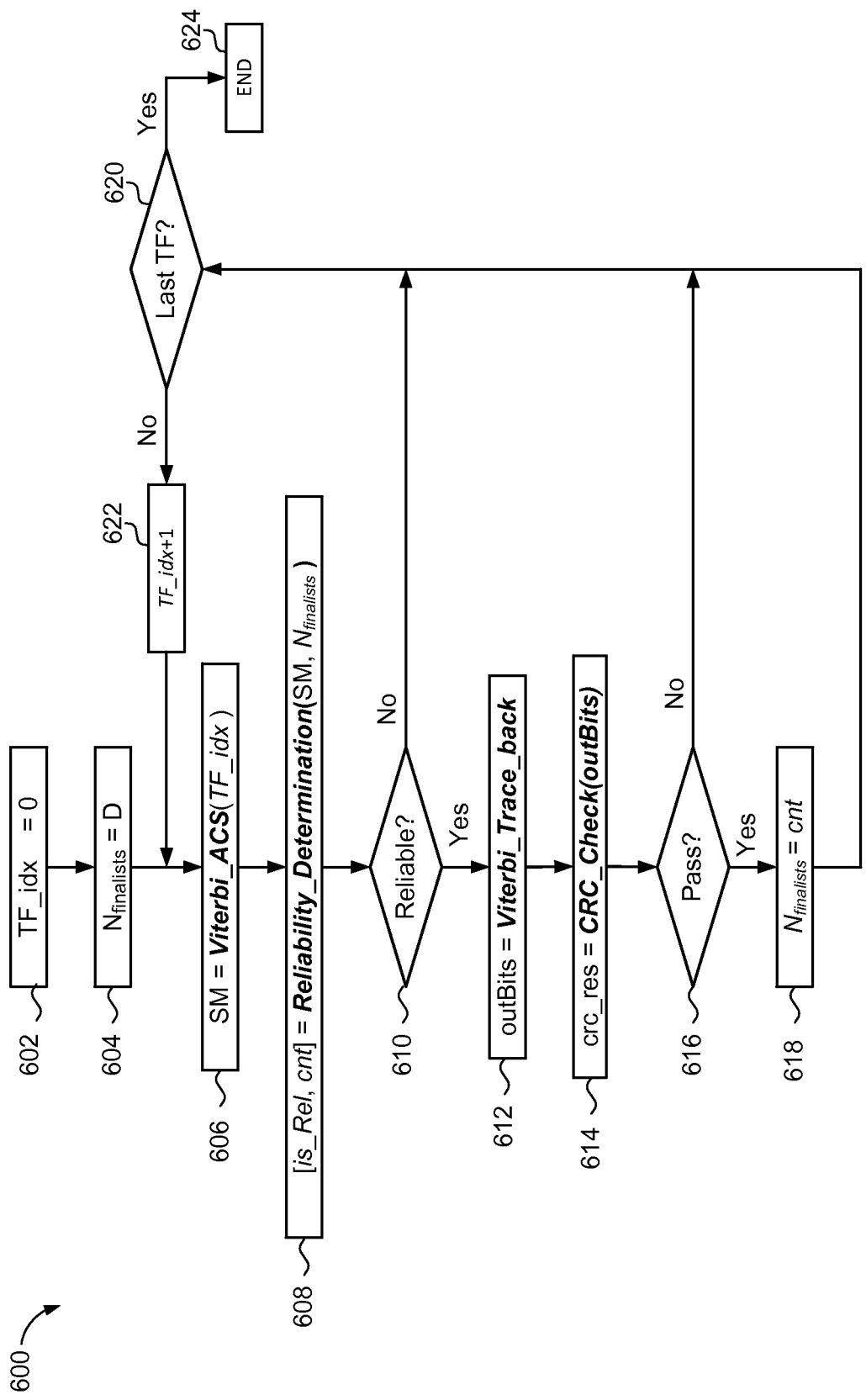
FIG. 6 is a block diagram illustrating aspects of an example user equipment including a reliability determination component according to the present disclosure.

Referring to FIG. 6, in an aspect, a UE such as UE 102 (FIG. 1) may perform one aspect of a method 600 for reducing CRC false detection. Method 600 may be performed or executed by UE 102 (FIG. 1) and/or any one or more of the components and/or subcomponents of UE 102 (FIG. 1) (e.g., reliability determination component 130, FIG. 1). It should be understood that any one or more of the reliability determination component 130, Viterbi decoder 110, CRC component 120 and/or communications component 350 may be configured to execute all or a portion of method 500.

At block 602, method 600 may initialize or otherwise receive the transport format index (TF_idx) at value zero (e.g., index zero). Additionally, at block 604, method 600 may initialize or otherwise set $N_{finalists}$ threshold value (e.g., alternatively referred to as second threshold 338, FIG. 3) to a value of "D." Further, at block 606, method 600 may set the state metric value (SM) to a value equal to an output of the Viterbi decoder having input index of TF-idx. At block 608, method 600 may determine reliability of the state metric value by comparing the state metric value to $N_{finalists}$. In some aspects, any one of methodology 400 (FIG. 4) and 500 (FIG. 5) may be implemented as part of block 608.

The output or decision may be received at block 610, where a determination is made on whether the output is reliable. Method 600 may proceed to block 620 when a determination of an unreliable state metric value is made at block 610. Otherwise, method 600 may proceed to block 612, where output bits (outBits) from Viterbi traceback procedure are obtained. Further, at block 614, the outBits from block 612 are then checked or verified using a CRC procedure. At block 616, a determination may be made whether the CRC procedure resulted in a pass for the outBits (e.g., corresponding to the state metric).

Method 600 may proceed to block 620 when a failure or no pass is determined at block 616. Otherwise, method 600 may proceed to block 618 when a CRC pass is determined at block 616. Specifically, at block 618, the $N_{finalists}$ threshold value may be set to a counter value. Further, at block 620, method 600 may determine whether a last transport format (TF) has been reached. If not, method 600 may proceed to block 622 to increment the transport format and proceed back to block 84. Otherwise, method 600 may proceed to block 624, where the method may end.

Figure 7:
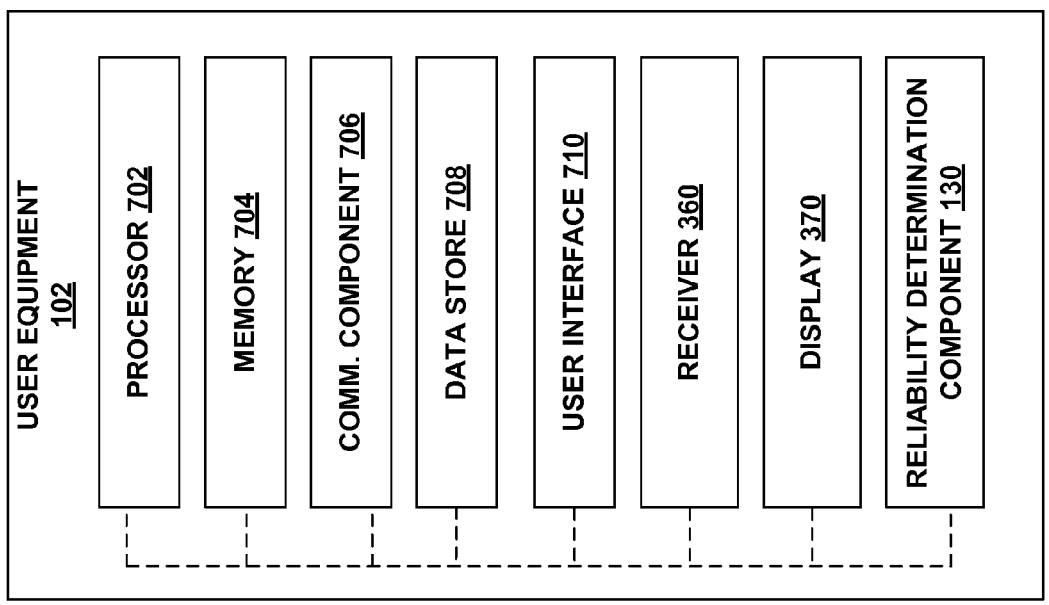
FIG. 7 is a block diagram conceptually illustrating an example of a telecommunications system including a user equipment with a reliability determination component according to the present disclosure.

As illustrated in FIG. 7, UE 102 may include a processor 702, memory 704, communications component 706, data store 708, user interface 710, receiver 360, display 370, and/or reliability determination component 130. Reliability determination component 130 may be implemented partially or fully in a specially programmed or configured computer device to perform the functions described herein. Further, in an implementation, UE 102 may include reliability determination component 130 and its sub-components, including receiving component 352, state metric value determining component 354, counter incrementing component 356, counter comparing component 358, and/or packet transmission component 362, in specially programmed computer readable instructions or code, firmware, hardware, or some combination thereof.

In an aspect, for example as represented by the dashed lines, reliability determination component 130 may be implemented in or executed using one or any combination of processor 702, memory 704, communications component 706, and data store 708. For example, reliability determination component 130 may be defined or otherwise programmed as one or more processor modules of processor 702. Further, for example, reliability determination component 130 may be defined as a computer-readable readable medium stored in memory 704 and/or data store 708 and executed by processor 702. Moreover, for example, inputs and outputs relating to operations of reliability determination component 130 may be provided or supported by communications component 706, which may provide a bus between the components of computer device 700 or an interface for communication with external devices or components.

UE 102 may include processor 702 specially configured to carry out processing functions associated with one or more of components and functions described herein. Processor 702 can include a single or multiple set of processors or multi-core processors. Moreover, processor 702 can be implemented as an integrated processing system and/or a distributed processing system.

User equipment 102 further includes memory 704, such as for storing data used herein and/or local versions of applications and/or instructions or code being executed by processor 702, such as to perform the respective functions of the respective entities described herein. Memory 704 can include any type of memory usable by a computer, such as random access memory (RAM), read only memory (ROM), tapes, magnetic discs, optical discs, volatile memory, non-volatile memory, and any combination thereof.

Further, user equipment 102 includes communications component 706 (e.g., same as or similar to communications component 350) that provides for establishing and maintaining communications with one or more parties utilizing hardware, software, and services as described herein. Communications component 706 may carry communications between components on user equipment 102, as well as between user and external devices, such as devices located across a communications network and/or devices serially or locally connected to user equipment 102. For example, communications component 706 may include one or more buses operable for interfacing with external devices.

Additionally, user equipment 102 may further include data store 708, which can be any suitable combination of hardware and/or software, that provides for mass storage of information, databases, and programs employed in connection with aspects described herein. For example, data store 708 may be a data repository for applications not currently being executed by processor 702.

User equipment 102 may additionally include a user interface 710 operable to receive inputs from a user of user equipment 102, and further operable to generate outputs for presentation to the user. User interface 710 may include one or more input devices, including but not limited to a keyboard, a number pad, a mouse, a touch-sensitive display (e.g., display 370), a navigation key, a function key, a microphone, a voice recognition component, any other mechanism capable of receiving an input from a user, or any combination thereof. Further, user interface 710 may include one or more output devices, including but not limited to a display (e.g., display 370), a speaker, a haptic feedback mechanism, a printer, any other mechanism capable of presenting an output to a user, or any combination thereof. Additionally, UE 102 may include receiver 360 for receiving and decoding RF signals, which may be included in a transceiver at the UE.

The various concepts presented throughout this disclosure may be implemented across a broad variety of telecommunication systems, network architectures, and communication standards.

Figure 8:
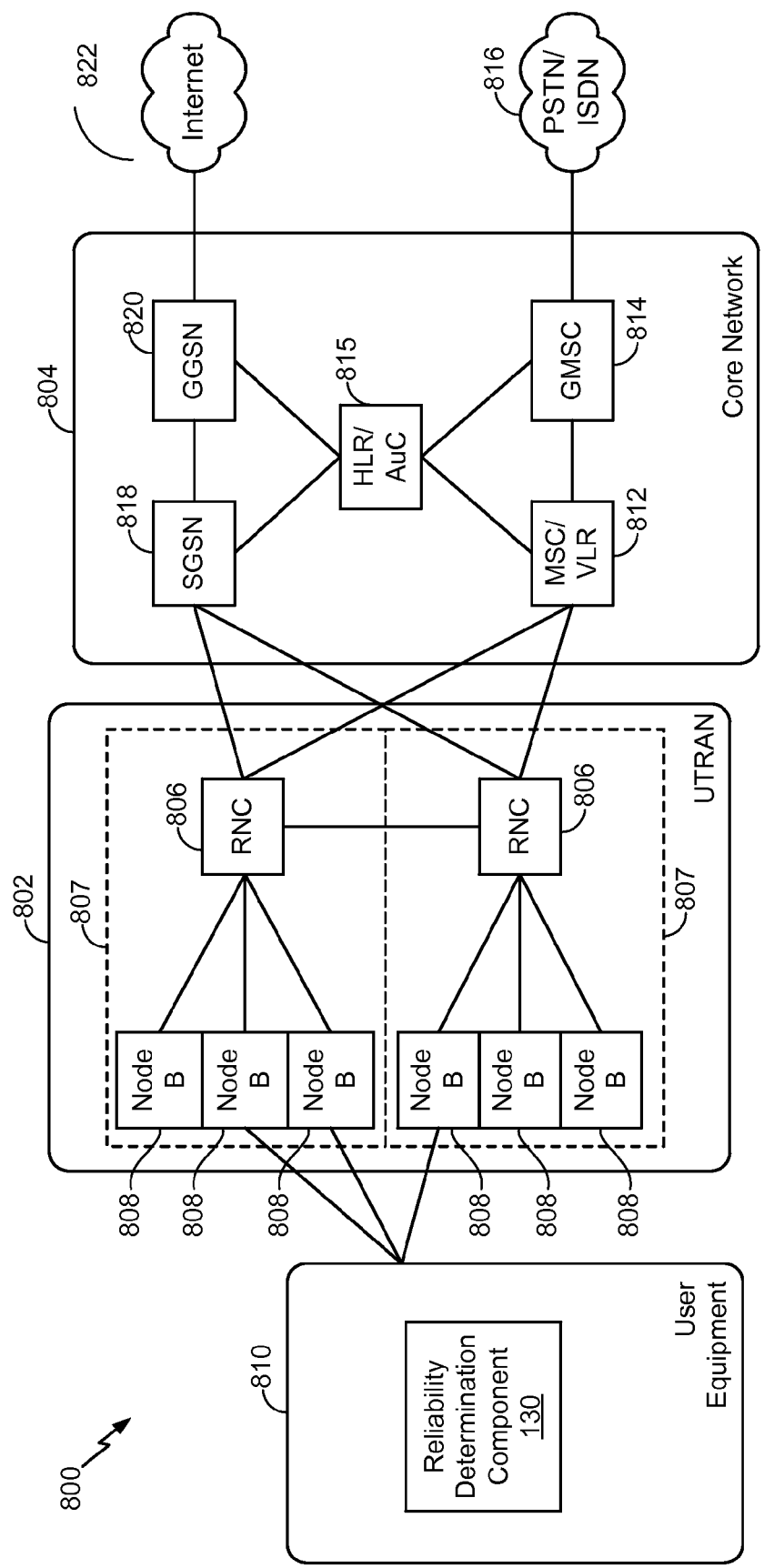
FIG. 8 is a conceptual diagram illustrating an example of an access network including a user equipment with a reliability determination component according to the present disclosure.

By way of example and without limitation, the aspects of the present disclosure illustrated in FIG. 8 are presented with reference to a UMTS system 800 employing a W-CDMA air interface. A UMTS network includes three interacting domains: a Core Network (CN) 804, a UMTS Terrestrial Radio Access Network (UTRAN) 802, and User Equipment (UE) 810 that may be the same as or similar to UE 102 including reliability determination component 130 (FIG. 1). In this example, the UTRAN 802 provides various wireless services including telephony, video, data, messaging, broadcasts, and/or other services. The UTRAN 802 may include a plurality of Radio Network Subsystems (RNSs) such as an RNS 807, each controlled by a respective Radio Network Controller (RNC) such as an RNC 206. Here, the UTRAN 802 may include any number of RNCs 206 and RNSs 807 in addition to the RNCs 806 and RNSs 807 illustrated herein. The RNC 206 is an apparatus responsible for, among other things, assigning, reconfiguring and releasing radio resources within the RNS 807. The RNC 206 may be interconnected to other RNCs (not shown) in the UTRAN

802 through various types of interfaces such as a direct physical connection, a virtual network, or the like, using any suitable transport network.

Communication between a UE 810 and a Node B 808 may be considered as including a physical (PHY) layer and a medium access control (MAC) layer. Further, communication between a UE 810 and an RNC 806 by way of a respective Node B 808 may be considered as including a radio resource control (RRC) layer. In the instant specification, the PHY layer may be considered layer 1; the MAC layer may be considered layer 2; and the RRC layer may be considered layer 3. Information herein below utilizes terminology introduced in the RRC Protocol Specification, 3GPP TS 25.331 v9.1.0, incorporated herein by reference.

The geographic region covered by the RNS 807 may be divided into a number of cells, with a radio transceiver apparatus serving each cell. A radio transceiver apparatus is commonly referred to as a Node B in UMTS applications, but may also be referred to by those skilled in the art as a base station (BS), a base transceiver station (BTS), a radio base station, a radio transceiver, a transceiver function, a basic service set (BSS), an extended service set (ESS), an access point (AP), or some other suitable terminology. For clarity, three Node Bs 808 are shown in each RNS 807; however, the RNSs 807 may include any number of wireless Node Bs. The Node Bs 808 provides wireless access points to a CN 204 for any number of mobile apparatuses.

Examples of a mobile apparatus include a cellular phone, a smart phone, a session initiation protocol (SIP) phone, a laptop, a notebook, a netbook, a smartbook, a personal digital assistant (PDA), a satellite radio, a global positioning system (GPS) device, a multimedia device, a video device, a digital audio player (e.g., MP3 player), a camera, a game console, or any other similar functioning device. The mobile apparatus is commonly referred to as a UE in UMTS applications, but may also be referred to by those skilled in the art as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a terminal, a user agent, a mobile client, a client, or some other suitable terminology. For illustrative purposes, one UE 810 is shown in communication with a number of the Node Bs 808. The DL, also called the forward link, refers to the communication link from a Node B 808 to a UE 810, and the UL, also called the reverse link, refers to the communication link from a UE 810 to a Node B 808.

The CN 804 interfaces with one or more access networks, such as the UTRAN 802. As shown, the CN 804 is a GSM core network. However, as those skilled in the art will recognize, the various concepts presented throughout this disclosure may be implemented in a RAN, or other suitable access network, to provide UEs with access to types of CNs other than GSM networks.

The CN 804 includes a circuit-switched (CS) domain and a packet-switched (PS) domain. Some of the circuit-switched elements are a Mobile services Switching Centre (MSC), a Visitor location register (VLR) and a Gateway MSC. Packet-switched elements include a Serving GPRS Support Node (SGSN) and a Gateway GPRS Support Node (GGSN). Some network elements, like EIR, HLR, VLR and AuC may be shared by both of the circuit-switched and packet-switched domains. In the illustrated example, the CN 804 supports circuit-switched services with a MSC 812 and a GMSC 814. In some applications, the GMSC 814 may be referred to as a media gateway (MGW). One or more RNCs, such as the RNC 806, may be connected to the MSC 812. The MSC 812 is an apparatus that controls call setup, call routing, and UE mobility functions.

The MSC 812 also includes a VLR that contains subscriber-related information for the duration that a UE is in the coverage area of the UTRAN 802. The GMSC 814 provides a gateway through the MSC 812 for the UE to access a circuit-switched network 816. The GMSC 814 includes a home location register (HLR) 815 containing subscriber data, such as the data reflecting the details of the services to which a particular user has subscribed. The HLR is also associated with an authentication center (AuC) that contains subscriber-specific authentication data. When a call is received for a particular UE, the GMSC 814 queries the HLR 815 to determine the UE's location and forwards the call to the particular MSC serving that location.

The CN 804 also supports packet-data services with a serving GPRS support node (SGSN) 818 and a gateway GPRS support node (GGSN) 820. GPRS, which stands for General Packet Radio Service, is designed to provide packet-data services at speeds higher than those available with standard circuit-switched data services. The GGSN 820 provides a connection for the UTRAN 802 to a packet-based network 822. The packet-based network 822 may be the Internet, a private data network, or some other suitable packet-based network. The primary function of the GGSN 820 is to provide the UEs 810 with packet-based network connectivity. Data packets may be transferred between the GGSN 820 and the UEs 810 through the SGSN 818, which performs primarily the same functions in the packet-based domain as the MSC 812 performs in the circuit-switched domain.

An air interface for UMTS may utilize a spread spectrum Direct-Sequence Code Division Multiple Access (DS-CDMA) system. The spread spectrum DS-CDMA spreads user data through multiplication by a sequence of pseudo-random bits called chips. The "wideband" W-CDMA air interface for UMTS is based on such direct sequence spread spectrum technology and additionally calls for a frequency division duplexing (FDD). FDD uses a different carrier frequency for the UL and DL between a Node B 808 and a UE 810. Another air interface for UMTS that utilizes DS-CDMA, and uses time division duplexing (TDD), is the TD-SCDMA air interface. Those skilled in the art will recognize that although various examples described herein may refer to a W-CDMA air interface, the underlying principles may be equally applicable to a TD-SCDMA air interface.

An HSPA air interface includes a series of enhancements to the 3G/W-CDMA air interface, facilitating greater throughput and reduced latency. Among other modifications over prior releases, HSPA utilizes hybrid automatic repeat request (HARQ), shared channel transmission, and adaptive modulation and coding. The standards that define HSPA include HSDPA (high speed downlink packet access) and HSUPA (high speed uplink packet access, also referred to as enhanced uplink, or EUL).

HSDPA utilizes as its transport channel the high-speed downlink shared channel (HS-DSCH). The HS-DSCH is implemented by three physical channels: the high-speed physical downlink shared channel (HS-PDSCH), the high-speed shared control channel (HS-SCCH), and the high-speed dedicated physical control channel (HS-DPCCH).

Among these physical channels, the HS-DPCCH carries the HARQ ACK/NACK signaling on the uplink to indicate whether a corresponding packet transmission was decoded successfully. That is, with respect to the downlink, the UE 810 provides feedback to the node B 808 over the HS-DPCCH to indicate whether it correctly decoded a packet on the downlink.

HS-DPCCH further includes feedback signaling from the UE 810 to assist the node B 808 in taking the right decision in terms of modulation and coding scheme and precoding weight selection, this feedback signaling including the CQI and PCI.

"HSPA Evolved" or HSPA+ is an evolution of the HSPA standard that includes MIMO and 64-QAM, enabling increased throughput and higher performance. That is, in an aspect of the disclosure, the node B 808 and/or the UE 810 may have multiple antennas supporting MIMO technology. The use of MIMO technology enables the node B 808 to exploit the spatial domain to support spatial multiplexing, beamforming, and transmit diversity.

Multiple Input Multiple Output (MIMO) is a term generally used to refer to multi-antenna technology, that is, multiple transmit antennas (multiple inputs to the channel) and multiple receive antennas (multiple outputs from the channel). MIMO systems generally enhance data transmission performance, enabling diversity gains to reduce multipath fading and increase transmission quality, and spatial multiplexing gains to increase data throughput.

Spatial multiplexing may be used to transmit different streams of data simultaneously on the same frequency. The data steams may be transmitted to a single UE 210 to increase the data rate or to multiple UEs 810 to increase the overall system capacity. This is achieved by spatially precoding each data stream and then transmitting each spatially precoded stream through a different transmit antenna on the downlink. The spatially precoded data streams arrive at the UE(s) 810 with different spatial signatures, which enables each of the UE(s) 810 to recover the one or more the data streams destined for that UE 810. On the uplink, each UE 810 may transmit one or more spatially precoded data streams, which enables the node B 808 to identify the source of each spatially precoded data stream.

Spatial multiplexing may be used when channel conditions are good. When channel conditions are less favorable, beamforming may be used to focus the transmission energy in one or more directions, or to improve transmission based on characteristics of the channel. This may be achieved by spatially precoding a data stream for transmission through multiple antennas. To achieve good coverage at the edges of the cell, a single stream beamforming transmission may be used in combination with transmit diversity.

Generally, for MIMO systems utilizing n transmit antennas, n transport blocks may be transmitted simultaneously over the same carrier utilizing the same channelization code. Note that the different transport blocks sent over the n transmit antennas may have the same or different modulation and coding schemes from one another.

On the other hand, Single Input Multiple Output (SIMO) generally refers to a system utilizing a single transmit antenna (a single input to the channel) and multiple receive antennas (multiple outputs from the channel). Thus, in a SIMO system, a single transport block is sent over the respective carrier.

Figure 9:
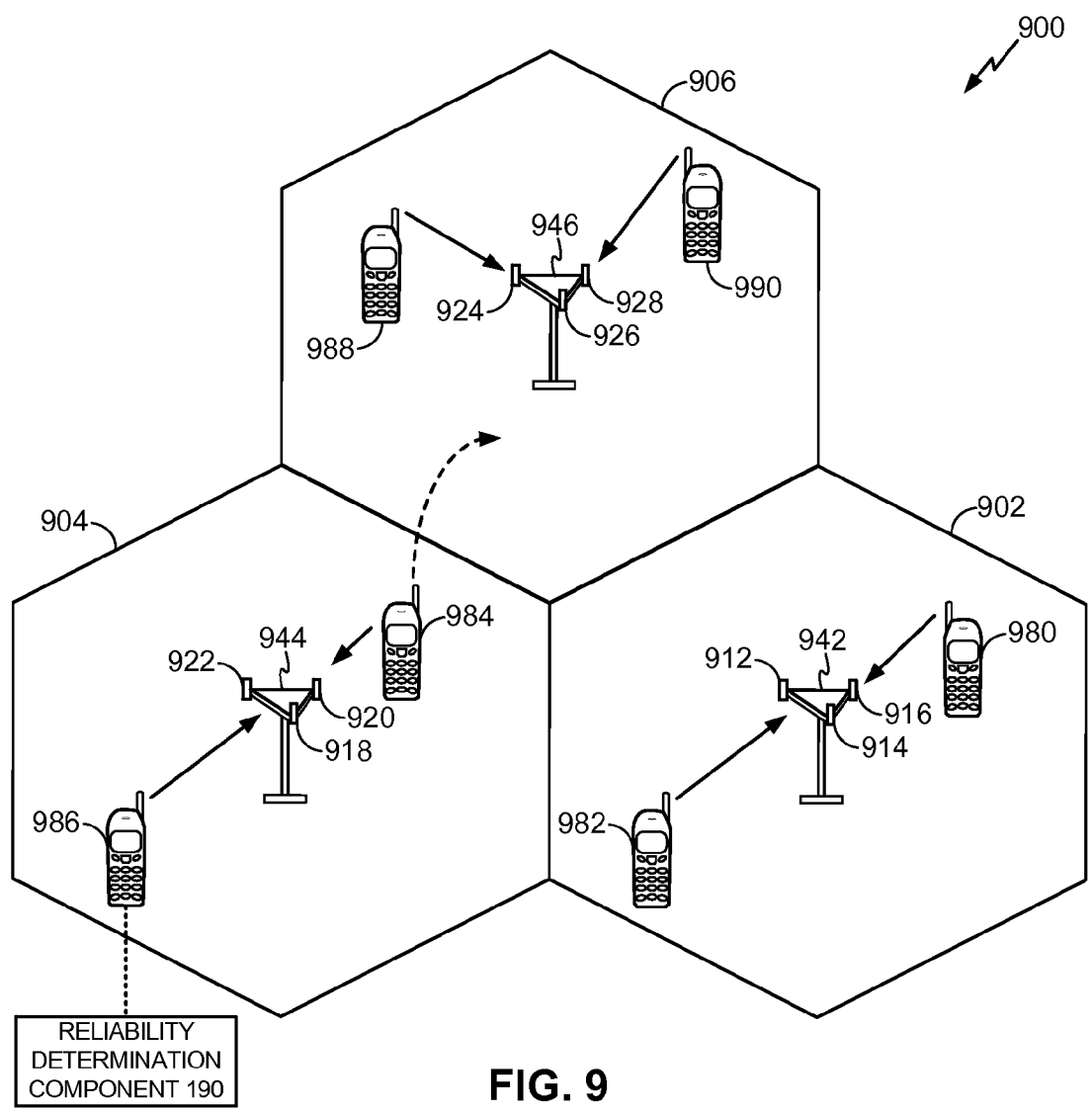
FIG. 9 is a conceptual diagram illustrating an example of a radio protocol architecture for the user and control plane that may be used by the user equipment of the present disclosure.

Referring to FIG. 9, an access network 900 in a UTRAN architecture is illustrated, and may include one or more UEs 980, 982, 984, 986, 988, and 990, which may be the same or similar to UE 102 (FIGS. 1 and 3) in that they are configured to include reliability determination component 130 (FIGS. 1 and 3; for example, illustrated here as being associated with UE 986) for reducing CRC false detections. The multiple access wireless communication system includes multiple cellular regions (cells), including cells 902, 904, and 906, each of which may include one or more sectors. The multiple sectors can be formed by groups of antennas with each antenna responsible for communication with UEs in a portion of the cell. For example, in cell 902, antenna groups 912, 914, and 916 may each correspond to a different sector. In cell 904, antenna groups 918, 920, and 922 each correspond to a different sector. In cell 906, antenna groups 924, 926, and 928 each correspond to a different sector. The cells 902, 904 and 906 may include several wireless communication devices, e.g., User Equipment or UEs, which may be in communication with one or more sectors of each cell 902, 904 or 906. For example, UEs 980 and 982 may be in communication with Node B 942, UEs 984 and 986 may be in communication with Node B 944, and UEs 988 and 940 can be in communication with Node B 946. Here, each Node B 942, 944, 946 is configured to provide an access point to a CN 804 (see FIG. 8) for all the UEs 980, 982, 984, 986, 988, 990 in the respective cells 902, 904, and 906. In an aspect, the UEs 980, 982, 984, 986, 988 and/or 990 may include reliability determination component 130 (FIG. 1).

As the UE 984 moves from the illustrated location in cell 904 into cell 906, a serving cell change (SCC) or handover may occur in which communication with the UE 984 transitions from the cell 904, which may be referred to as the source cell, to cell 906, which may be referred to as the target cell. Management of the handover procedure may take place at the UE 984, at the Node Bs corresponding to the respective cells, at a radio network controller 806 (see FIG. 8), or at another suitable node in the wireless network. For example, during a call with the source cell 904, or at any other time, the UE 984 may monitor various parameters of the source cell 904 as well as various parameters of neighboring cells such as cells 906 and 902. Further, depending on the quality of these parameters, the UE 984 may maintain communication with one or more of the neighboring cells. During this time, the UE 984 may maintain an Active Set, that is, a list of cells that the UE 984 is simultaneously connected to (i.e., the UTRA cells that are currently assigning a downlink dedicated physical channel DPCH or fractional downlink dedicated physical channel F-DPCH to the UE 984 may constitute the Active Set).

The modulation and multiple access scheme employed by the access network 900 may vary depending on the particular telecommunications standard being deployed. By way of example, the standard may include Evolution-Data Optimized (EV-DO) or Ultra Mobile Broadband (UMB). EV-DO and UMB are air interface standards promulgated by the 3rd Generation Partnership Project 2 (3GPP2) as part of the CDMA2000 family of standards and employs CDMA to provide broadband Internet access to mobile stations. The standard may alternately be Universal Terrestrial Radio Access (UTRA) employing Wideband-CDMA (W-CDMA) and other variants of CDMA, such as TD-SCDMA; Global System for Mobile Communications (GSM) employing TDMA; and Evolved UTRA (E-UTRA), Ultra Mobile Broadband (UMB), IEEE 802.11 (Wi-Fi), IEEE 802.16 (WiMAX), IEEE 802.20, and Flash-OFDM employing OFDMA. UTRA, E-UTRA, UMTS, LTE, LTE Advanced, and GSM are described in documents from the 3GPP organization. CDMA2000 and UMB are described in documents from the 3GPP2 organization. The actual wireless communication standard and the multiple access technology employed will depend on the specific application and the overall design constraints imposed on the system.

The radio protocol architecture may take on various forms depending on the particular application. An example for an HSPA system will now be presented with reference to FIG. 10.

Figure 10:
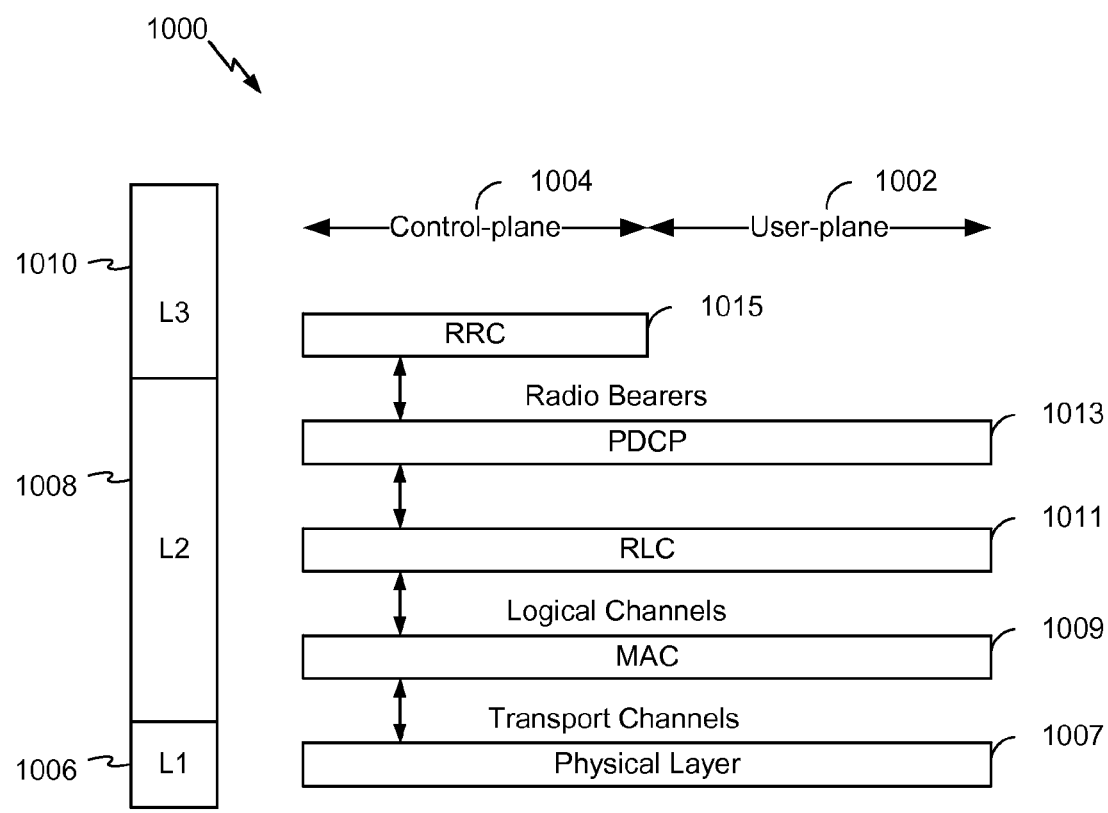
FIG. 10 is a block diagram conceptually illustrating an example of a Node B in communication with a UE, which includes a reliability determination component according to the present disclosure, in a telecommunications system in accordance with an aspect of the present disclosure.

Referring to FIG. 10, an example radio protocol architecture 1000 relates to the user plane 1002 and the control plane 1004 of a user equipment (UE) or node B/base station. For example, architecture 1000 may be included in a UE such as UE 102 including reliability determination component 130 (FIGS. 1 and 3). The radio protocol architecture 1000 for the UE and node B is shown with three layers: Layer 1 1006, Layer 2 1008, and Layer 3 1010. Layer 1 1006 is the lowest lower and implements various physical layer signal processing functions. As such, Layer 1 1006 includes the physical layer 1007. Layer 2 (L2 layer) 1008 is above the physical layer 1007 and is responsible for the link between the UE and node B over the physical layer 1007. Layer 3 (L3 layer) 1010 includes a radio resource control (RRC) sublayer 1015. The RRC sublayer 1015 handles the control plane signaling of Layer 3 between the UE and the UTRAN.

In the user plane, the L2 layer 1008 includes a media access control (MAC) sublayer 1009, a radio link control (RLC) sublayer 1011, and a packet data convergence protocol (PDCP) 1013 sublayer, which are terminated at the node B on the network side. Although not shown, the UE may have several upper layers above the L2 layer 1008 including a network layer (e.g., IP layer) that is terminated at a PDN gateway on the network side, and an application layer that is terminated at the other end of the connection (e.g., far end UE, server, etc.).

The PDCP sublayer 1013 provides multiplexing between different radio bearers and logical channels. The PDCP sublayer 1013 also provides header compression for upper layer data packets to reduce radio transmission overhead, security by ciphering the data packets, and handover support for UEs between node Bs. The RLC sublayer 1011 provides segmentation and reassembly of upper layer data packets, retransmission of lost data packets, and reordering of data packets to compensate for out-of-order reception due to hybrid automatic repeat request (HARQ). The MAC sublayer 1009 provides multiplexing between logical and transport channels. The MAC sublayer 1009 is also responsible for allocating the various radio resources (e.g., resource blocks) in one cell among the UEs. The MAC sublayer 1009 is also responsible for HARQ operations.

Figure 11:
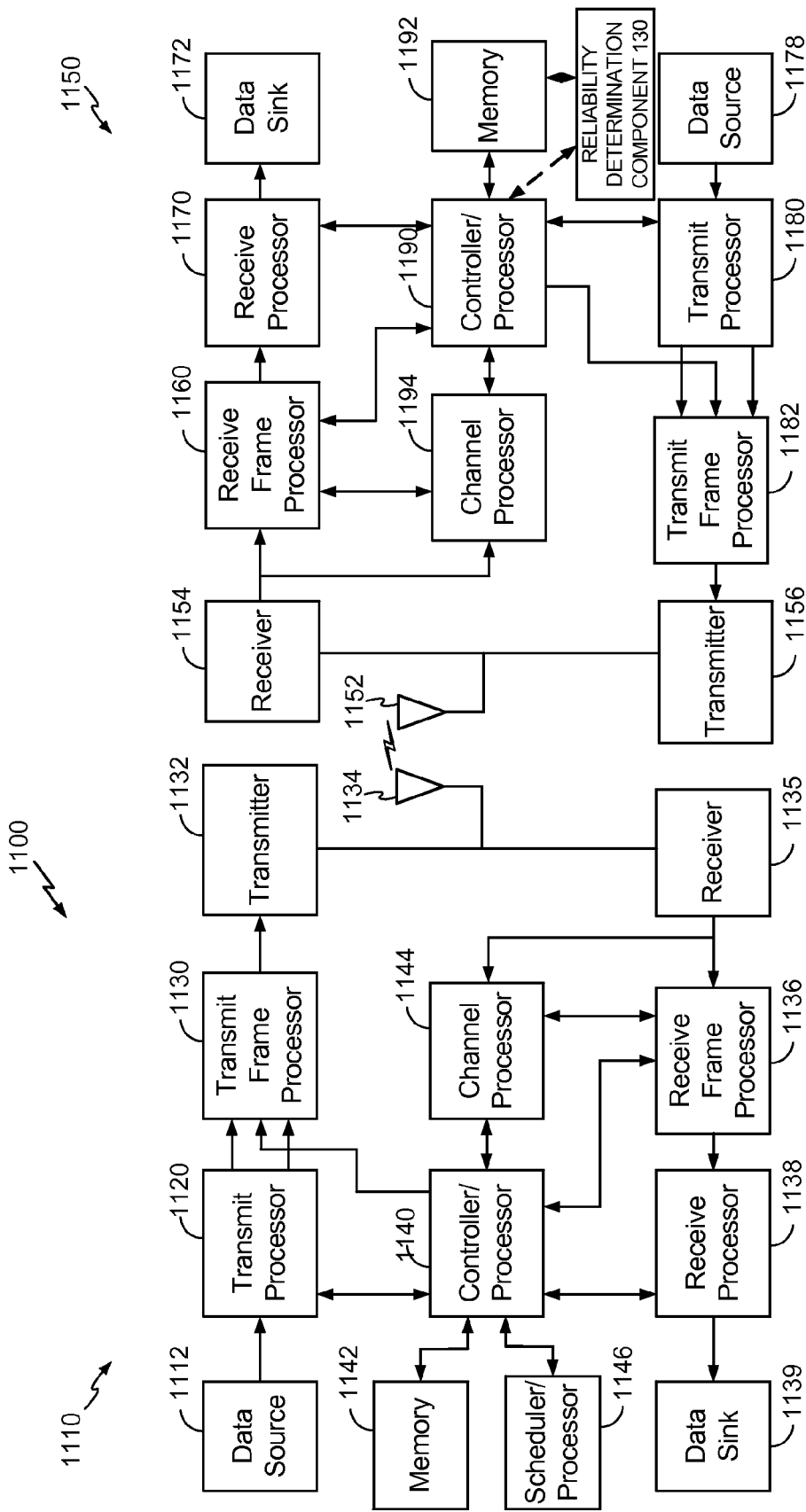
FIG. 11 is a block diagram conceptually illustrating an example of a Node B in communication with a UE, which includes a reliability determination component according to the present disclosure, in a telecommunications system.

FIG. 11 is a block diagram of a Node B 1110 in communication with a UE 1150, where the Node B 1110 may be base station 314 in FIG. 3, and the UE 1150 may be the UE 102 in FIGS. 1-2 which may include reliability determination component 130 in FIG. 1 for reducing cyclic redundancy check (CRC) false detections at UE 102. In the downlink communication, a transmit processor 1120 may receive data from a data source 1112 and control signals from a controller/processor 1140. The transmit processor 1120 provides various signal processing functions for the data and control signals, as well as reference signals (e.g., pilot signals).

For example, the transmit processor 1120 may provide cyclic redundancy check (CRC) codes for error detection, coding and interleaving to facilitate forward error correction (FEC), mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM), and the like), spreading with orthogonal variable spreading factors (OVSF), and multiplying with scrambling codes to produce a series of symbols.

Channel estimates from a channel processor 1144 may be used by a controller/processor 1140 to determine the coding, modulation, spreading, and/or scrambling schemes for the transmit processor 1120. These channel estimates may be derived from a reference signal transmitted by the UE 1150 or from feedback from the UE 1150. The symbols generated by the transmit processor 1120 are provided to a transmit frame processor 1130 to create a frame structure. The transmit frame processor 1130 creates this frame structure by multiplexing the symbols with information from the controller/processor 1140, resulting in a series of frames. The frames are then provided to a transmitter 1132, which provides various signal conditioning functions including amplifying, filtering, and modulating the frames onto a carrier for downlink transmission over the wireless medium through antenna 1134. The antenna 1134 may include one or more antennas, for example, including beam steering bidirectional adaptive antenna arrays or other similar beam technologies.

At the UE 1150, a receiver 1154 receives the downlink transmission through an antenna 1152 and processes the transmission to recover the information modulated onto the carrier. The information recovered by the receiver 1154 is provided to a receive frame processor 1160, which parses each frame, and provides information from the frames to a channel processor 1194 and the data, control, and reference signals to a receive processor 1170. The receive processor 1170 then performs the inverse of the processing performed by the transmit processor 1120 in the Node B 1110. More specifically, the receive processor 1170 descrambles and despreads the symbols, and then determines the most likely signal constellation points transmitted by the Node B 1110 based on the modulation scheme.

These soft decisions may be based on channel estimates computed by the channel processor 1194. The soft decisions are then decoded and deinterleaved to recover the data, control, and reference signals. The CRC codes are then checked to determine whether the frames were successfully decoded. The data carried by the successfully decoded frames will then be provided to a data sink 1172, which represents applications running in the UE 1150 and/or various user interfaces (e.g., display). Control signals carried by successfully decoded frames will be provided to a controller/processor 1190. When frames are unsuccessfully decoded by the receive processor 1170, the controller/processor 1190 may also use an acknowledgement (ACK) and/or negative acknowledgement (NACK) protocol to support retransmission requests for those frames.

In the uplink, data from a data source 1178 and control signals from the controller/processor 1190 are provided to a transmit processor 1180. The data source 1178 may represent applications running in the UE 1150 and various user interfaces (e.g., keyboard). Similar to the functionality described in connection with the downlink transmission by the Node B 1110, the transmit processor 1180 provides various signal processing functions including CRC codes, coding and interleaving to facilitate FEC, mapping to signal constellations, spreading with OVSFs, and scrambling to produce a series of symbols.

Channel estimates, derived by the channel processor 1194 from a reference signal transmitted by the Node B 1110 or from feedback contained in the midamble transmitted by the Node B 1110, may be used to select the appropriate coding, modulation, spreading, and/or scrambling schemes. The symbols produced by the transmit processor 1180 will be provided to a transmit frame processor 1182 to create a frame structure. The transmit frame processor 1182 creates this frame structure by multiplexing the symbols with information from the controller/processor 1190, resulting in a series of frames. The frames are then provided to a transmitter 1156, which provides various signal conditioning functions including amplification, filtering, and modulating the frames onto a carrier for uplink transmission over the wireless medium through the antenna 1152.

The uplink transmission is processed at the Node B 1110 in a manner similar to that described in connection with the receiver function at the UE 1150. A receiver 1135 receives the uplink transmission through the antenna 1134 and processes the transmission to recover the information modulated onto the carrier. The information recovered by the receiver 1135 is provided to a receive frame processor 1136, which parses each frame, and provides information from the frames to the channel processor 1144 and the data, control, and reference signals to a receive processor 1138. The receive processor 1138 performs the inverse of the processing performed by the transmit processor 1180 in the UE 1150. The data and control signals carried by the successfully decoded frames may then be provided to a data sink 1139 and the controller/processor, respectively. If some of the frames were unsuccessfully decoded by the receive processor, the controller/processor 1140 may also use an acknowledgement (ACK) and/or negative acknowledgement (NACK) protocol to support retransmission requests for those frames.

The controller/processors 1140 and 1190 may be used to direct the operation at the Node B 1110 and the UE 1150, respectively. For example, the controller/processors 1140 and 1190 may provide various functions including timing, peripheral interfaces, voltage regulation, power management, and other control functions. The computer readable media of memories 1142 and 1192 may store data and software for the Node B 1110 and the UE 1150, respectively. A scheduler/processor 1146 at the Node B 1110 may be used to allocate resources to the UEs and schedule downlink and/or uplink transmissions for the UEs.

Several aspects of a telecommunications system have been presented with reference to a W-CDMA system. As those skilled in the art will readily appreciate, various aspects described throughout this disclosure may be extended to other telecommunication systems, network architectures and communication standards.

By way of example, various aspects may be extended to other UMTS systems such as TD-SCDMA, High Speed Downlink Packet Access (HSDPA), High Speed Uplink Packet Access (HSUPA), High Speed Packet Access Plus (HSPA+) and TD-CDMA. Various aspects may also be extended to systems employing Long Term Evolution (LTE) (in FDD, TDD, or both modes), LTE-Advanced (LTE-A) (in FDD, TDD, or both modes), CDMA2000, Evolution-Data Optimized (EV-DO), Ultra Mobile Broadband (UMB), IEEE 802.11 (Wi-Fi), IEEE 802.16 (WiMAX), IEEE 802.20, Ultra-Wideband (UWB), Bluetooth, and/or other suitable systems. The actual telecommunication standard, network architecture, and/or communication standard employed will depend on the specific application and the overall design constraints imposed on the system.

As noted above, such as with reference to FIGS. 1, 2 and 7, the above described managers, components, and other above described elements may be implemented in hardware, software, or a combination thereof. Further, as noted, one or more processors may be used to implement these various managers, components, and other elements in hardware, software or a combination thereof. For example, when implemented in software, one or more processors may be used to execute such software. In accordance with various aspects of the disclosure, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. Further, as previously noted, one or more processors may be used to execute software implementing the above described managers, components, and/or other elements. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

The software may reside on a computer-readable medium. The computer-readable medium may be a non-transitory computer-readable medium. A non-transitory computer-readable medium includes, by way of example, a magnetic storage device (e.g., hard disk, floppy disk, magnetic strip), an optical disk (e.g., compact disk (CD), digital versatile disk (DVD)), a smart card, a flash memory device (e.g., card, stick, key drive), random access memory (RAM), read only memory (ROM), programmable ROM (PROM), erasable PROM (EPROM), electrically erasable PROM (EEPROM), a register, a removable disk, and any other suitable medium for storing software and/or instructions that may be accessed and read by a computer.

The computer-readable medium may also include, by way of example, a carrier wave, a transmission line, and any other suitable medium for transmitting software and/or instructions that may be accessed and read by a computer. The computer-readable medium may be resident in the processing system, external to the processing system, or distributed across multiple entities including the processing system. The computer-readable medium may be embodied in a computer-program product. By way of example, a computer-program product may include a computer-readable medium in packaging materials. Those skilled in the art will recognize how best to implement the described functionality presented throughout this disclosure depending on the particular application and the overall design constraints imposed on the overall system.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more."

Unless specifically stated otherwise, the term "some" refers to one or more. A phrase referring to "at least one of" a list of items refers to any combination of those items, including single members. As an example, "at least one of: a, b, or c" is intended to cover: at least one a; at least one b; at least one c; at least one a and at least one b; at least one a and at least one c; at least one b and at least one c; and at least one a, at least one b and at least one c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A method for reducing cyclic redundancy check (CRC) false detections at a user equipment (UE), comprising:
   receiving a data packet at the UE;
   determining whether a state metric value for each of a plurality of vector elements of a last path metric vector of the data packet is less than or equal to a first threshold;
   incrementing a counter when the state metric value of a vector element is less than or equal to the first threshold, wherein the counter is incremented for each of the plurality of vector elements in which the state metric value is less than or equal to the first threshold;
   determining whether the counter is lower than a second threshold; and
   providing the data packet to an upper layer protocol entity of the UE when a CRC pass for the data packet is determined and the counter is lower than the second threshold.

2. The method of claim 1, wherein the state metric value indicates a total path metric value from state zero at time zero to a state at end of the data packet.

3. The method of claim 1, wherein the first threshold is set to a state metric value of state zero.

4. The method of claim 1, wherein the second threshold is initially set to a value of 256.

5. The method of claim 4, further comprising:
   decreasing the second threshold when the counter is lower than the second threshold and the CRC pass for the data packet is determined.

6. The method of claim 1, wherein a number of tail bits are present at the end of the data packet.

7. The method of claim 6, wherein the tail bits include eight tail bits, and wherein each of the eight tail bits has a value of zero.

8. An apparatus for reducing cyclic redundancy check (CRC) false detections, comprising:
   means for receiving a data packet at the UE;
   means for determining whether a state metric value for each of a plurality of vector elements of a last path metric vector of the data packet is less than or equal to a first threshold;
   means for incrementing a counter when the state metric value of a vector element is less than or equal to the first threshold, wherein the counter is incremented for each of the plurality of vector elements in which the state metric value is less than or equal to the first threshold;
   means for determining whether the counter is lower than a second threshold; and
   means for providing the data packet to an upper layer protocol entity of the UE when a CRC pass for the data packet is determined and the counter is lower than the second threshold.

9. The apparatus of claim 8, wherein the state metric value indicates a total path metric value from state zero at time zero to a state at end of the data packet.

10. The apparatus of claim 8, wherein the first threshold is set to a state metric value of state zero.

11. The apparatus of claim 8, wherein the second threshold is initially set to a value of 256.

12. The apparatus of claim 11, further comprising:
    means for decreasing the second threshold when the counter is lower than the second threshold and the CRC pass for the data packet is determined.

13. The apparatus of claim 8, wherein a number of tail bits are present at the end of the data packet.

14. The apparatus of claim 13, wherein the tail bits include eight tail bits, and wherein each of the eight tail bits has a value of zero.

15. A computer readable medium storing computer executable code for reducing cyclic redundancy check (CRC) false detections at a user equipment (UE), comprising:
    code for receiving a data packet at the UE;
    code for determining whether a state metric value for each of a plurality of vector elements of a last path metric vector of the data packet is less than or equal to a first threshold;
    code for incrementing a counter when the state metric value of a vector element of the plurality of vector elements is less than or equal to the first threshold, wherein the counter is incremented for each of the plurality of vector elements in which the state metric value is less than or equal to the first threshold;
    code for determining whether the counter is lower than a second threshold; and
    code for providing the data packet to an upper layer protocol entity of the UE when a CRC pass for the data packet is determined and the counter is lower than the second threshold.

16. The computer readable medium of claim 15, wherein the state metric value indicates a total path metric value from state zero at time zero to a state at end of the data packet.

17. The computer readable medium of claim 15, wherein the first threshold is set to a state metric value of state zero.

18. The computer readable medium of claim 15, wherein the second threshold is initially set to a value of 256.

19. The computer readable medium of claim 18, further comprising:
    code for decreasing the second threshold when the counter is lower than the second threshold and the CRC pass for the data packet is determined.

20. The computer readable medium of claim 15, wherein a number of tail bits are present at the end of the data packet.

21. The computer readable medium of claim 20, wherein the tail bits include eight tail bits, and wherein each of the eight tail bits has a value of zero.

22. A mobile apparatus to reduce cyclic redundancy check (CRC) false detections, comprising:
    a receiver configured to receive a data packet; and
    a processor coupled to a memory, the processor configured to:

determine whether a state metric value for each of a plurality of vector elements of a last path metric vector of the data packet is less than or equal to a first threshold;

increment a counter when the state metric value of a vector element of the plurality of vector elements is less than or equal to the first threshold, wherein the counter is incremented for each of the plurality of vector elements in which the state metric value is less than or equal to the first threshold;

determine whether the counter is lower than a second threshold; and provide the data packet to an upper layer protocol entity of the UE when a CRC pass for the data packet is determined and the counter is lower than the second threshold.

23. The mobile apparatus of claim 22, wherein the state metric value indicates a total path metric value from state zero at time zero to a state at end of the data packet.

24. The mobile apparatus of claim 22, wherein the first threshold is set to a state metric value of state zero.

25. The mobile apparatus of claim 22, wherein the second threshold is initially set to a value of 256.

26. The mobile apparatus of claim 25, wherein the processor is further configured to:

decrease the second threshold when the counter is lower than the second threshold and the CRC pass for the data packet is determined.

27. The mobile apparatus of claim 22, wherein a number of tail bits are present at the end of the data packet.

28. The mobile apparatus of claim 27, wherein the tail bits include eight tail bits, and wherein each of the eight tail bits has a value of zero.

29. The mobile apparatus of claim 22, further comprising a user interface and a display.

* * * * *